(12) United States Patent
Amarilio et al.

(10) Patent No.: US 9,520,865 B2
(45) Date of Patent: Dec. 13, 2016

(54) DELAY CIRCUITS AND RELATED SYSTEMS AND METHODS

(71) Applicant: QUALCOMM Incorporated, San Diego, CA (US)

(72) Inventors: Lior Amarilio, Yokneam (IL); Alexander Golubitski, Nazareth Illit (IL); Haim Hagay Haller, Haifa (IL); Felix Kolmakov, Haifa (IL); Gilad Sthoeger, Eshchar (IL)

(73) Assignee: QUALCOMM Incorporated, San Diego, CA (US)

( * ) Notice: Subject to any disclaimer, the term of this patent is extended or adjusted under 35 U.S.C. 154(b) by 324 days.

(21) Appl. No.: 14/477,367

(22) Filed: Sep. 4, 2014

(65) Prior Publication Data

US 2016/0072492 A1    Mar. 10, 2016

(51) Int. Cl.
*G06F 1/12* (2006.01)
*H03K 5/13* (2014.01)
(Continued)

(52) U.S. Cl.
CPC ............. *H03K 5/133* (2013.01); *G06F 1/10* (2013.01); *G06F 13/4068* (2013.01); *G06F 13/4221* (2013.01); *G11C 19/00* (2013.01); *H03K 5/13* (2013.01); *H03K 2005/0015* (2013.01); *Y02B 60/1228* (2013.01); *Y02B 60/1235* (2013.01)

(58) Field of Classification Search
USPC .......................... 713/400–503; 327/291–298
See application file for complete search history.

(56) References Cited

U.S. PATENT DOCUMENTS

| 4,882,505 A | * | 11/1989 | Furman | H03K 5/15093 |
| | | | | 327/273 |
| 5,517,638 A | * | 5/1996 | Szczepanek | H04L 7/0083 |
| | | | | 327/141 |

(Continued)

FOREIGN PATENT DOCUMENTS

WO    2013088664 A1    6/2013

OTHER PUBLICATIONS

Invitation to Pay Additional Fees and, Where Applicable, Protest Fee and Partial International Search for PCT/US2015/047153, mailed Nov. 19, 2015, 9 pages.

(Continued)

*Primary Examiner* — Paul R Myers
(74) *Attorney, Agent, or Firm* — Withrow & Terranova, PLLC

(57) ABSTRACT

Delay circuits, and related systems and methods are disclosed. In one aspect, a delay circuit is provided that uses logic to delay accurately an output enable signal to reduce or avoid data hazards within a slave device. The delay circuit includes two shift register chains configured to receive an output enable in signal based on a slow clock. A first shift register chain is clocked by a positive edge of a fast clock, and provides a first strobe signal. A second shift register chain is clocked by a negative edge of the fast clock, and provides a second strobe signal. The logic uses the first and second strobe signals, and the output enable in signal, to provide a delayed output enable out signal. The delay circuit provides a highly accurate time delay for the output enable signal to reduce or avoid data hazards in an area and power efficient manner.

25 Claims, 8 Drawing Sheets

(51) Int. Cl.
*G11C 19/00* (2006.01)
*G06F 13/40* (2006.01)
*G06F 13/42* (2006.01)
*G06F 1/10* (2006.01)
*H03K 5/00* (2006.01)

(56) References Cited

U.S. PATENT DOCUMENTS

| | | | |
|---|---|---|---|
| 6,343,364 B1 | 1/2002 | Leydier et al. | |
| 6,798,248 B2 * | 9/2004 | Hazucha | H03K 3/0315 |
| | | | 326/93 |
| 7,098,706 B1 | 8/2006 | Pasqualini | |
| 7,296,170 B1 * | 11/2007 | Richmond | G06F 1/04 |
| | | | 327/144 |
| 7,355,482 B2 | 4/2008 | Meltzer | |
| 7,932,768 B2 | 4/2011 | Bourstein et al. | |
| 8,166,221 B2 | 4/2012 | Lee et al. | |
| 8,773,189 B2 * | 7/2014 | Jung | H03L 7/0805 |
| | | | 327/291 |
| 2001/0020859 A1 * | 9/2001 | Saeki | H03K 5/133 |
| | | | 327/271 |
| 2008/0036518 A1 * | 2/2008 | Hong | H03K 5/1565 |
| | | | 327/291 |
| 2008/0178024 A1 | 7/2008 | Kamegawa | |
| 2008/0265967 A1 | 10/2008 | Goller | |
| 2009/0033387 A1 | 2/2009 | Heragu et al. | |
| 2011/0119475 A1 * | 5/2011 | Chen | G06F 1/08 |
| | | | 713/2 |
| 2013/0322461 A1 | 12/2013 | Poulsen | |

OTHER PUBLICATIONS

International Search Report and Written Opinion for PCT/US2015/047153, mailed Mar. 15, 2016, 26 pages.
Invitation to Restrict or Pay Additional Fees for PCT/US2015/047153, mailed Jul. 27, 2016, 7 pages.
Second Written Opinion for PCT/US2015/047153, mailed Sep. 12, 2016, 16 pages.

* cited by examiner

DELAY CIRCUITS AND RELATED SYSTEMS AND METHODS

BACKGROUND

I. Field of the Disclosure

The technology of the disclosure relates generally to delay circuits, and particularly to delay circuits for devices that receive a clock signal from a data bus.

II. Background

Electronic devices, such as mobile phones and computer tablets, have become common in contemporary society for supporting various everyday uses. These electronic devices each commonly include a microphone and speakers. Typical microphones and speakers used in electronic devices have analog interfaces, requiring dedicated two (2) port wiring to connect each device. However, electronic devices may include multiple audio devices, such as multiple microphones and/or speakers. Thus, it may be desired to allow for a microprocessor or other control device in such electronic devices to be able to communicate audio data to multiple audio devices over a common communications bus. Further, it may also be desired to provide a defined communications protocol for transporting digital data relating to audio channels to different audio devices in an electronic device over a common communications bus.

In this regard, the MIPI® Alliance has announced SoundWire™ as a communications protocol for transporting digital data relating to audio channels to different audio devices associated with an electronic device. In SoundWire™, one SoundWire™ master interface allows a master electronic device ("master device"), or monitor communicatively coupled thereto, to communicate over a common communications bus with one or more slave electronic devices ("slave devices") coupled to SoundWire™ slave interfaces. As of this writing, the current version of SoundWire™ is revision 0.6-r02, which was made internally available on May 6, 2014 to MIPI Alliance members through the MIPI sharepoint file server.

The common communications bus in SoundWire™ includes two separate wires: a common data wire ("DATA") and a common clock wire ("CLK"). In an attempt to provide a low power consumption environment, the SoundWire™ protocol employs a modified Non Return to Zero Inverted ("NRZI") encoding scheme in conjunction with a double data rate ("DDR"), wherein DATA is examined, and potentially driven, upon every transition of a clock signal on CLK. Employing a NRZI encoding scheme with DDR in this manner affects signaling such that the SoundWire™ protocol suggests a need for a delay circuit in each slave device to avoid data hazards caused by improper signal timing. However, delay circuits that provide the delay necessary for a slave device to avoid data hazards typically generate approximate delays while consuming area and power within the slave device. Therefore, it would be advantageous to provide a more accurate delay to a slave device so as to avoid data hazards, while also reducing area and power consumption of a corresponding delay circuit.

SUMMARY OF THE DISCLOSURE

Aspects disclosed in the detailed description include delay circuits and related systems and methods. In one aspect, a delay circuit is provided that uses simple logic to delay accurately an output enable signal so as to reduce or avoid data hazards within a slave device. This logic is configured to provide a highly accurate delay by taking advantage of a timing relationship between a fast clock and a corresponding slow clock. More specifically, the delay circuit includes two separate shift register chains configured to receive an output enable in signal that is based on the slow clock. The first shift register chain is clocked by a positive edge of the fast clock, thus providing a resulting first strobe signal in response to a positive transition of the fast clock. The second shift register chain is clocked by a negative edge of the fast clock, thus providing a resulting second strobe signal in response to a negative edge of the fast clock. Triggering the shift register chains using opposite edges of the fast clock allows a corresponding delay to remain accurate relative to the fast clock. In this manner, the simple logic uses the first and second strobe signals, in conjunction with the output enable in signal, to provide a delayed output enable out signal. Therefore, creating a delay based on the fast clock and the slow clock, by employing logic in conjunction with the shift register chains, allows the delay circuit to provide a highly accurate time delay for the output enable signal so as to reduce or avoid data hazards in an area and power efficient manner.

In this regard in one aspect, a delay circuit for delaying an output enable signal is disclosed. The delay circuit comprises a first shift register chain. The first shift register chain comprises a first chain input configured to receive an output enable in signal, wherein the output enable in signal is based on a slow clock signal. The first shift register chain further comprises a first chain clock input configured to receive a fast clock signal and a first chain output configured to provide a first strobe signal. The delay circuit further comprises a second shift register chain. The second shift register chain comprises a second chain input configured to receive the output enable in signal and a second chain clock input configured to receive the fast clock signal. The second shift register chain further comprises a second chain output configured to provide a second strobe signal, wherein each transition of the second strobe signal is opposite of a corresponding transition of the first strobe signal. The delay circuit further comprises a delayed output configured to provide an output enable out signal based on the first strobe signal, the second strobe signal, and the output enable in signal.

In another aspect, a method for delaying an output enable signal is disclosed. The method comprises receiving a fast clock signal and a slow clock signal. The method further comprises receiving an output enable in signal, wherein the output enable in signal is based on the slow clock signal. The method further comprises generating a first strobe signal based on the output enable in signal and the fast clock signal. The method further comprises generating a second strobe signal based on the output enable in signal and the fast clock signal, wherein each transition of the second strobe signal is opposite of each corresponding transition of the first strobe signal. The method further comprises providing an output enable out signal based on the first strobe signal, the second strobe signal, and the output enable in signal.

In another aspect, a delay circuit for delaying an output enable is disclosed. The delay circuit comprises a first shift register chain configured to generate a first strobe signal. The delay circuit further comprises a second shift register chain configured to generate a second strobe signal, wherein each transition of the second strobe signal is opposite of each corresponding transition of the first strobe signal. The delay circuit further comprises a delayed output configured to provide an output enable out signal based on the first strobe signal, the second strobe signal, and an input signal.

In another aspect, a SoundWire™ device is disclosed. The SoundWire™ device comprises a SoundWire™ communications bus. The SoundWire™ communications bus comprises a data wire and a clock wire. The SoundWire™ device further comprises a master device coupled to one or more slave devices via the SoundWire™ communications bus. Each of the one or more slave devices comprises a delay circuit. Each delay circuit among a plurality of delay circuits comprises a first shift register chain. The first shift register chain comprises a first chain input configured to receive an output enable in signal, wherein the output enable in signal is based on a slow clock signal provided on the clock wire. The first shift register chain further comprises a first chain clock input configured to receive a fast clock signal. The first shift register chain further comprises a first chain output configured to provide a first strobe signal. Each delay circuit among the plurality of delay circuits further comprises a second shift register chain. The second shift register chain comprises a second chain input configured to receive the output enable in signal. The second shift register chain further comprises a second chain clock input configured to receive the fast clock signal. The second shift register chain further comprises a second chain output configured to provide a second strobe signal, wherein each transition of the second strobe signal is opposite of each corresponding transition of the first strobe signal. Each delay circuit among the plurality of delay circuits further comprises a delayed output configured to provide an output enable out signal based on the first strobe signal, the second strobe signal, and the output enable in signal.

DETAILED DESCRIPTION

Figure 1:
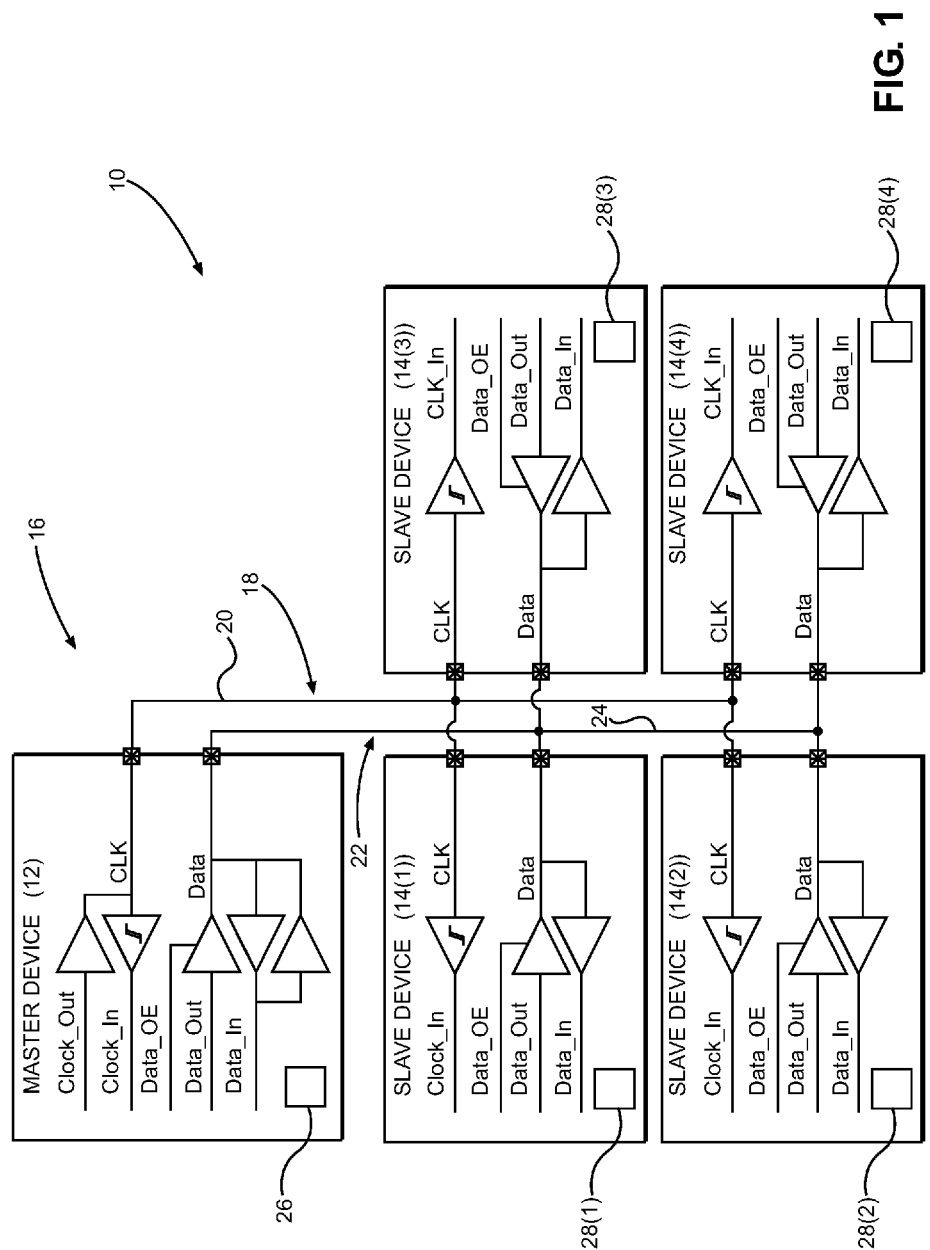
FIG. 1 is a block diagram of an exemplary SoundWire™ system that includes a master device coupled to a plurality of slave devices.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include delay circuits and related systems and methods. In one aspect, a delay circuit is provided that uses simple logic to delay accurately an output enable signal so as to reduce or avoid data hazards within a slave device. This logic is configured to provide a highly accurate delay by taking advantage of a timing relationship between a fast clock and a corresponding slow clock. More specifically, the delay circuit includes two separate shift register chains configured to receive an output enable in signal that is based on the slow clock. The first shift register chain is clocked by a positive edge of the fast clock, thus providing a resulting first strobe signal in response to a positive transition of the fast clock. The second shift register chain is clocked by a negative edge of the fast clock, thus providing a resulting second strobe signal in response to a negative edge of the fast clock. Triggering the shift register chains using opposite edges of the fast clock allows a corresponding delay to remain accurate relative to the fast clock. In this manner, the simple logic uses the first and second strobe signals, in conjunction with the output enable in signal, to provide a delayed output enable out signal. Therefore, creating a delay based on the fast clock and the slow clock, by employing logic in conjunction with the shift register chains, allows the delay circuit to provide a highly accurate time delay for the output enable signal so as to reduce or avoid data hazards in an area and power efficient manner.

Before discussing the delay circuit aspects disclosed herein, an exemplary SoundWire™ system is first described. In this regard, FIG. 1 is a block diagram of an exemplary SoundWire™ system 10 having one (1) master device 12 and four (4) slave devices 14(1)-14(4) communicatively coupled to a SoundWire™ communications bus 16 as SoundWire™-compatible electronic devices. In an exemplary aspect, the slave devices 14(1)-14(4) may be microphones, speakers, or other audio devices. The master device 12 communicates with the slave devices 14(1)-14(4) using two (2) signals: a clock signal 18 communicated over a common clock wire 20 ("CLK 20"), and a data signal 22 communicated on a common data wire 24 ("DATA 24") of the SoundWire™ communications bus 16. While only four slave devices 14(1)-14(4) are illustrated in FIG. 1, it should be appreciated that the SoundWire™ specification supports up to eleven (11) slave devices 14 per master device 12. It should be appreciated that the master device 12 may have a control system 26 associated therewith, which may be a hardware implemented processor with associated software stored in memory associated with the processor. In an exemplary aspect, the control system 26 is part of the system on a chip (SoC) of the master device 12. In an alternate exemplary aspect, the control system 26 may be associated with a central processor for the computing device that includes the SoundWire™ system 10. In further exemplary aspects, the slave devices 14(1)-14(4) each have a respective slave control system 28(1)-28(4). Notably, while this aspect illustrates various elements within the master device 12 and the slave devices 14(1)-14(4), other aspects may include alternative elements or configurations and achieve similar functionality.

With continuing reference to FIG. 1, the SoundWire™ system 10 employs a modified Non Return to Zero Inverted ("NRZI") encoding scheme in conjunction with a double data rate ("DDR"), wherein the DATA 24 is examined, and potentially driven, upon every transition of the clock signal 18. As a non-limiting example, the DATA 24 may be driven by the slave devices 14(1)-14(4) based on a corresponding data output enable signal ("DATA_OE") of each respective slave device 14(1)-14(4). Driving the DATA 24 according to DDR in this manner causes a respective DATA_OE to potentially transition four (4) times during each cycle of the clock signal 18. More specifically, a respective DATA_OE may transition to a high logic level and drive a first data segment in response to the clock signal 18 transitioning to a high logic level. However, upon the clock signal 18 reaching a low logic level, the DATA_OE may transition to a low logic level so as to stop driving the first data segment, and subsequently transition to a high logic level to begin driving a second data segment. When the clock signal 18 again transitions to a high logic level, the DATA_OE may transition to a low logic level to stop driving the second data segment. Such multiple transitions of the DATA_OE during one cycle of the clock signal 18 increases the probability of data hazards in a corresponding slave device 14(1)-14(4) in the SoundWire™ system 10. To avoid such data hazards, the SoundWire™ protocol suggests delaying the DATA_OE accordingly.

Figure 2:
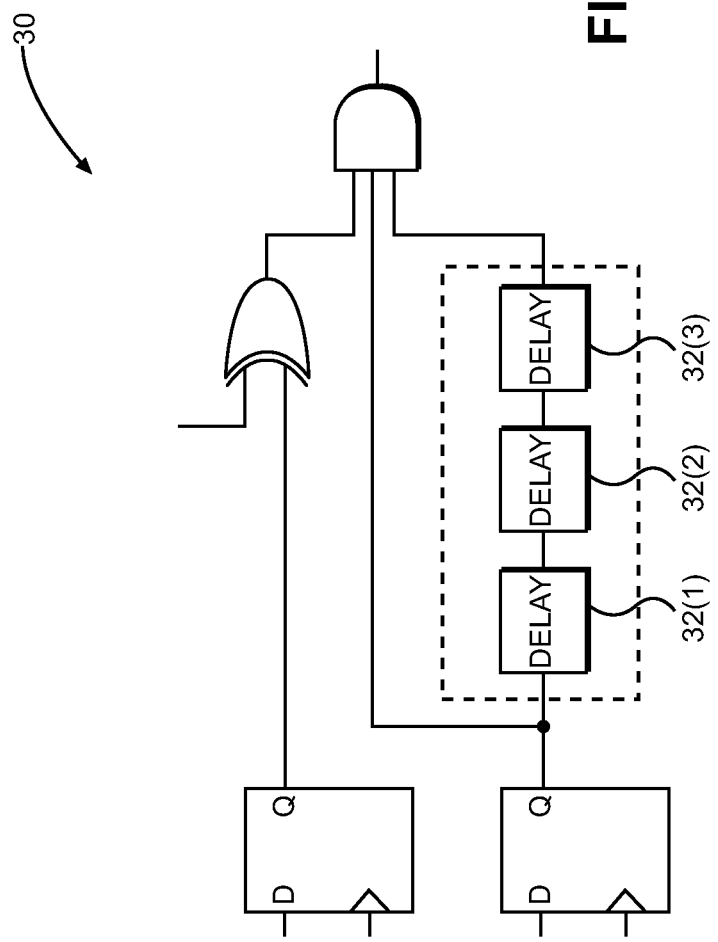
FIG. 2 is a block diagram of an exemplary delay circuit configured to provide an approximate delay to a slave device.

In this regard, FIG. 2 illustrates an exemplary conventional delay circuit 30 put forth by the SoundWire™ protocol that may be configured to delay a DATA_OE of a respective slave device 14(1)-14(4) in the SoundWire™ system 10. In particular, the conventional delay circuit 30 includes generic delay elements 32(1)-32(3) that may be configured to provide an approximate delay for a respective DATA_OE. As a non-limiting example, each generic delay element 32(1)-32(3) may be designed using library cells so as to provide a pre-defined, simple delay. By designing the generic delay elements 32(1)-32(3) using library cells in this manner, the conventional delay circuit 30 may consume less area and power as compared to employing analog circuitry to provide a delay based on tracking a phase of the clock signal 18. However, it is worth noting that the delay provided by the generic delay elements 32(1)-32(3) based on library cells may vary widely due to process, voltage, and temperature ("PVT") shifts in the SoundWire™ system 10. Thus, it would be advantageous to provide a more accurate delay for the DATA_OE of a slave device 14(1)-14(4) so as to avoid data hazards, while also reducing area and power consumption of the corresponding conventional delay circuit 30.

Figure 3:
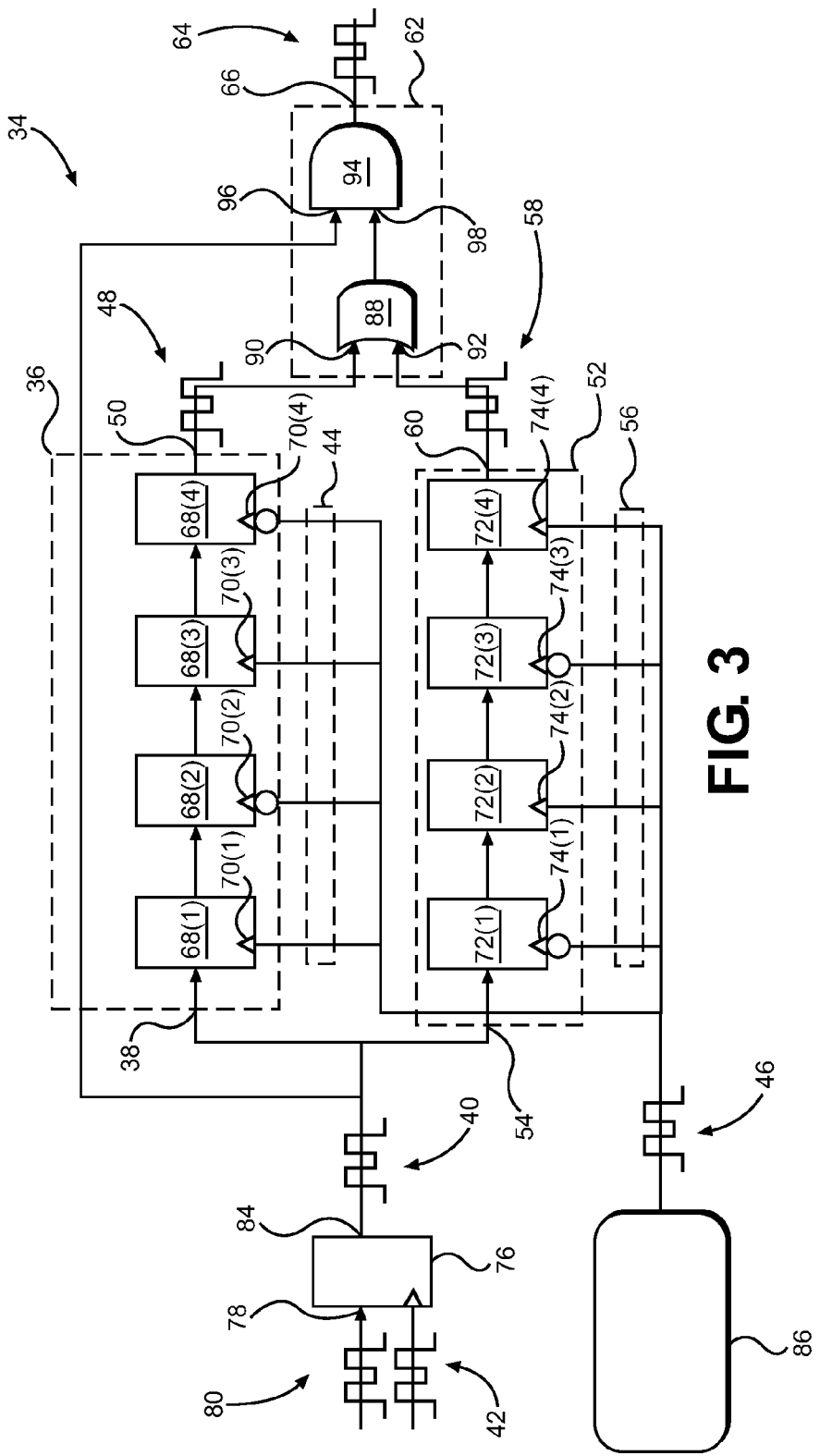
FIG. 3 is a block diagram of an exemplary delay circuit configured to provide a highly accurate delay to a slave device in an area and power efficient manner.

In this regard, FIG. 3 illustrates a delay circuit 34 corresponding to an exemplary aspect of the present disclosure. The delay circuit 34 is configured to provide a highly accurate delay of an output enable signal of devices similar to the master device 12 or the slave devices 14(1)-14(4) in FIG. 1, and may require less area and power than a delay circuit similar to the conventional delay circuit 30 in FIG. 2. More specifically, the delay circuit 34 includes a first shift register chain 36 having a first chain input 38 configured to receive an output enable in signal 40 that is based on a slow clock signal 42. The first shift register chain 36 also includes a first chain clock input 44 configured to receive a fast clock signal 46, wherein the fast clock signal 46 has a higher frequency than the slow clock signal 42. Upon a positive transition of the fast clock signal 46, the first shift register chain 36 is configured to provide a first strobe signal 48 on a first chain output 50. The delay circuit 34 also includes a second shift register chain 52 configured to receive the output enable in signal 40 on a second chain input 54. The second shift register chain 52 includes a second chain clock input 56 configured to receive the fast clock signal 46. In response to a negative transition of the fast clock signal 46, the second shift register chain 52 is configured to provide a second strobe signal 58 on a second chain output 60. Further, the delay circuit 34 includes simple logic 62 that uses the first strobe signal 48 and the second strobe signal 58 to provide an output enable out signal 64 on a delayed output 66, wherein the output enable out signal 64 is a delayed version of the output enable in signal 40.

With continuing reference to FIG. 3, in an exemplary aspect, the first shift register chain 36 includes first shift elements 68(1)-68(4). The fast clock signal 46 is provided to a corresponding clock input 70(1)-70(4) of each first shift element 68(1)-68(4). The first shift elements 68(1) and 68(3) are clocked in response to a positive transition of the fast clock signal 46, while the first shift elements 68(2) and 68(4) are clocked in response to a negative transition of the fast clock signal 46. Further, the second shift register chain 52 includes second shift elements 72(1)-72(4). The fast clock signal 46 is provided to a corresponding clock input 74(1)-74(4) of each second shift element 72(1)-72(4). The second shift elements 72(1) and 72(3) are clocked in response to a negative transition of the fast clock signal 46, while the second shift elements 72(2) and 72(4) are clocked in response to a positive transition of the fast clock signal 46. In this manner, each transition of the second strobe signal 58 is logically opposite of a corresponding transition of the first strobe signal 48. Thus, when the first strobe signal 48 possesses a high logic value, the second strobe signal 58 possesses a low logic value. Notably, although this exemplary aspect includes the first shift elements 68(1)-68(4) and the second shift elements 72(1)-72(4), other aspects may achieve similar functionality by employing an even number N of first shift elements 68(1)-68(N) and second shift elements 72(1)-72(N). In another exemplary aspect, the number of shift elements 68, 72 may vary. For example, there may be an even number N of first shift elements 68(1)-68(N) and an odd number M of second shift elements 72(1)-72(M) (or vice versa). In still another example, there may be an odd number M of first shift elements 68(1)-68(M) and an odd number M of second shift elements 72(1)-72(M).

With continuing reference to FIG. 3, in the exemplary aspect, the output enable in signal 40 is based on the slow clock signal 42 by way of a flip-flop 76. In particular, the flip-flop 76 includes a flip-flop input 78 configured to receive a data signal 80. The flip-flop 76 also includes a flip-flop clock input 82 configured to receive the slow clock signal 42. Thus, a flip-flop output 84 is configured to provide the output enable in signal 40. Additionally, the fast clock signal 46 in this exemplary aspect is generated by a fast clock, wherein the fast clock is a ring oscillator 86.

With continuing reference to FIG. 3, in this exemplary aspect, the simple logic 62 includes an OR logic gate 88 that is configured to receive the first strobe signal 48 on a first OR input 90, and receive the second strobe signal 58 on a second OR input 92. The simple logic 62 in this aspect also includes an AND logic gate 94 configured to receive the output enable in signal 40 on a first AND input 96, while a second AND input 98 is coupled to an OR output 100 of the OR logic gate 88. Further, the AND logic gate 94 is configured to generate the output enable out signal 64 on the delayed output 66 of the delay circuit 34. Notably, other aspects may use other OR-based and/or AND-based logic gates in place of the OR logic gate 88 and the AND logic gate 94, respectively, to achieve similar functionality. Creating a delay based on the fast clock signal 46 and the slow clock signal 42 by using the simple logic 62 in conjunction with the first shift register chain 36 and the second shift register chain 52 allows the delay circuit 34 to provide a highly accurate time delay for a DATA_OE of a slave device 14(1)-14(4) in FIG. 1. In this manner, the delay circuit 34 may provide a highly accurate time delay that reduces or avoids data hazards while potentially consuming less area and power as compared to generating delays using analog circuitry or library cells.

Figure 4:
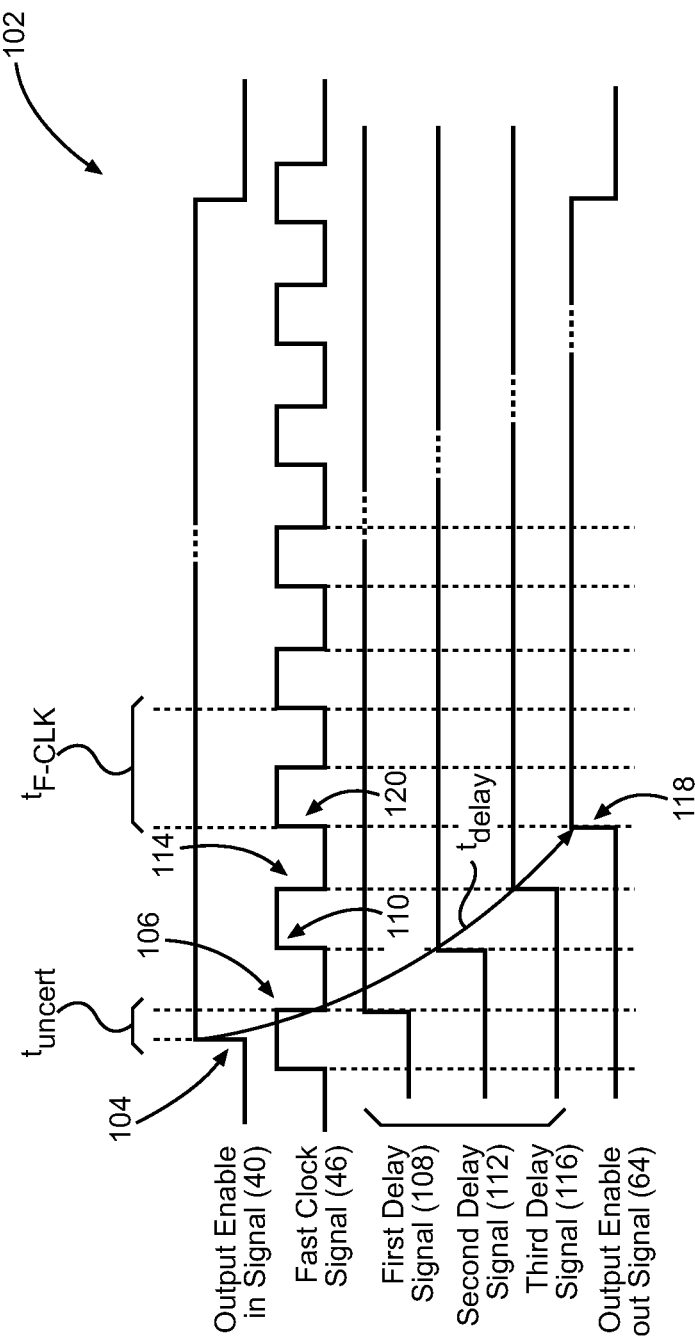
FIG. 4 is a timing diagram of exemplary signals generated by the delay circuit in FIG. 3.

In this regard, FIG. 4 illustrates a timing diagram of exemplary signals 102 generated by the delay circuit 34 in FIG. 3. In particular, the output enable in signal 40 transitions to a high logic value, as shown by arrow 104. In response to a first transition of the fast clock signal 46 following the output enable in signal 40 transitioning to a high logic value, as shown by arrow 106, a first delay signal 108 may be generated by the delay circuit 34 by sampling an output of the first shift element 68(1) and the second shift element 72(1). Similarly, in response to a second transition of the fast clock signal 46 following the output enable in signal 40 transitioning to a high logic value, as shown by arrow 110, a second delay signal 112 may be generated by the delay circuit 34 by sampling an output of the first shift element 68(2) and the second shift element 72(2). Further, in response to a third transition of the fast clock signal 46 following the output enable in signal 40 transitioning to a high logic value, as shown by arrow 114, a third delay signal 116 may be generated by the delay circuit 34 by sampling the output of the first shift element 68(3) and the second shift element 72(3). In this manner, because the first shift register chain 36 and the second shift register chain 52 each have four (4) stages in this exemplary aspect, the output enable out signal 64 transitions high, as indicated by arrow 118, in response to a fourth transition of the fast clock signal 46, as indicated by arrow 120. Thus, a delay ($t_{delay}$) generated by the delay circuit 34 may be created with a level of precision that is dependent on the number of stages employed by the first shift register chain 36 and the second shift register chain 52. Particularly, the delay ($t_{delay}$) generated by the delay circuit 34 may be calculated by way of the following equation:

$$t_{delay}=t_{uncert}+N*t_{F-clk/2} \qquad (Eq.\ 1)$$

In this regard, N is the number of stages employed by each of the first shift register chain 36 and the second register chain 52 (e.g., four (4) in the delay circuit 34); $t_{uncert}$ represents an uncertainty among phases of the fast clock signal 46 and the slow clock signal 42; and $t_{F-clk/2}$ represents one-half of a cycle of the fast clock signal 46. Therefore, as illustrated by the exemplary signals 102 in FIG. 4, the delay circuit 34 in FIG. 3 may be configured to provide a highly accurate time delay for the DATA_OE, as opposed to an approximate time delay generated by delay circuits employing library cells, such as the conventional delay circuit 30 in FIG. 2.

Figure 5:
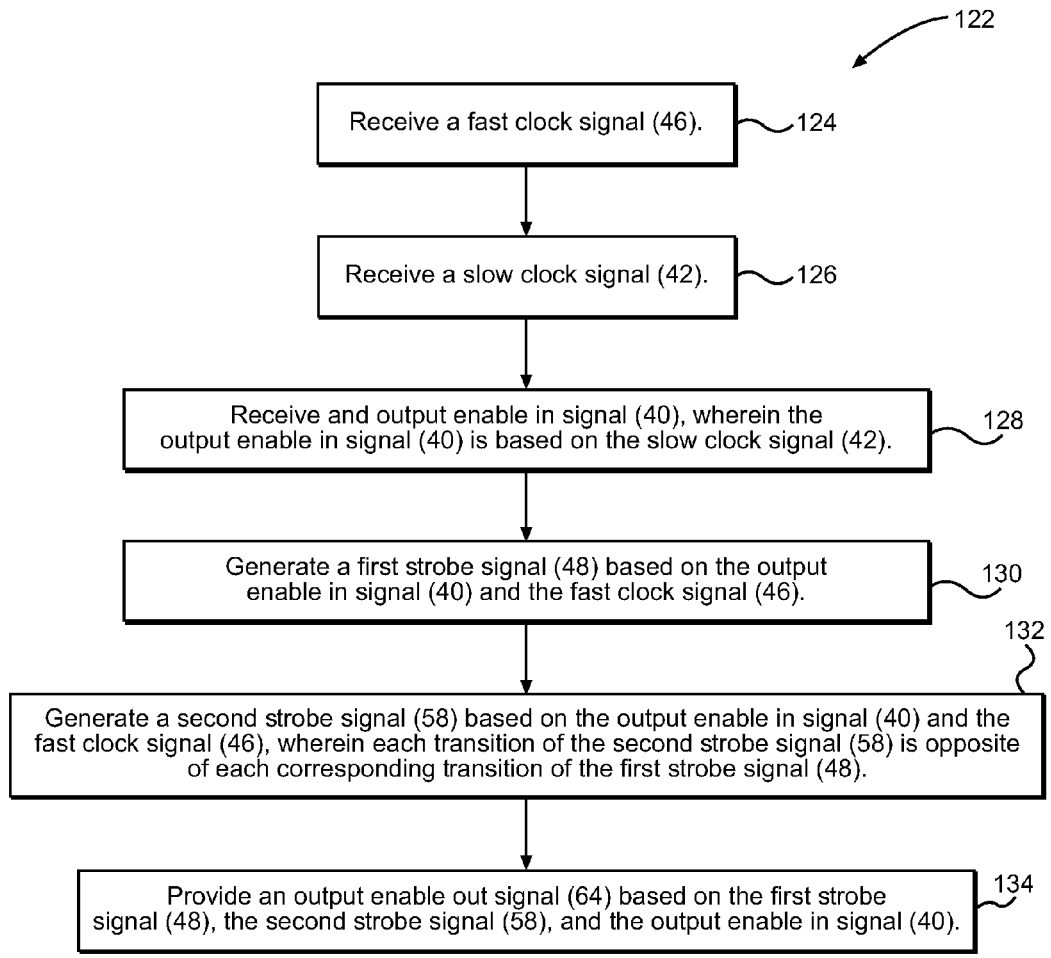
FIG. 5 is a flowchart illustrating an exemplary process for delaying an input signal by a highly accurate delay in an area and power efficient manner.

In this regard, FIG. 5 illustrates an exemplary process 122 employed by the delay circuit 34 in FIG. 3 for delaying the output enable in signal 40 by a highly accurate delay while potentially consuming less area and power as compared to generating delays using analog circuitry or library cells. In particular, the delay circuit 34 is configured to receive the fast clock signal 46 (block 124). The delay circuit 34 is configured to receive the slow clock signal 42 (block 126). Further, the delay circuit 34 is configured to receive the output enable in signal 40, wherein the output enable in signal 40 is based on the slow clock signal 42 (block 128). The delay circuit 34 is configured to generate the first strobe signal 48 based on the output enable in signal 40 and the fast clock signal 46 (block 130). The delay circuit 34 is also configured to generate the second strobe signal 58 based on the output enable in signal 40 and the fast clock signal 46, wherein each transition of the second strobe signal 58 is opposite of each corresponding transition of the first strobe signal 48 (block 132). Further, the delay circuit 34 is configured to provide the output enable out signal 64 based on the first strobe signal 48, the second strobe signal 58, and the output enable in signal 40 (block 134). By employing the process 122, the delay circuit 34 may provide a highly accurate delay that may reduce or avoid data hazards in the delay circuit 34 while potentially consuming less area and power as compared to generating delays using analog circuitry or library cells.

Figure 6:
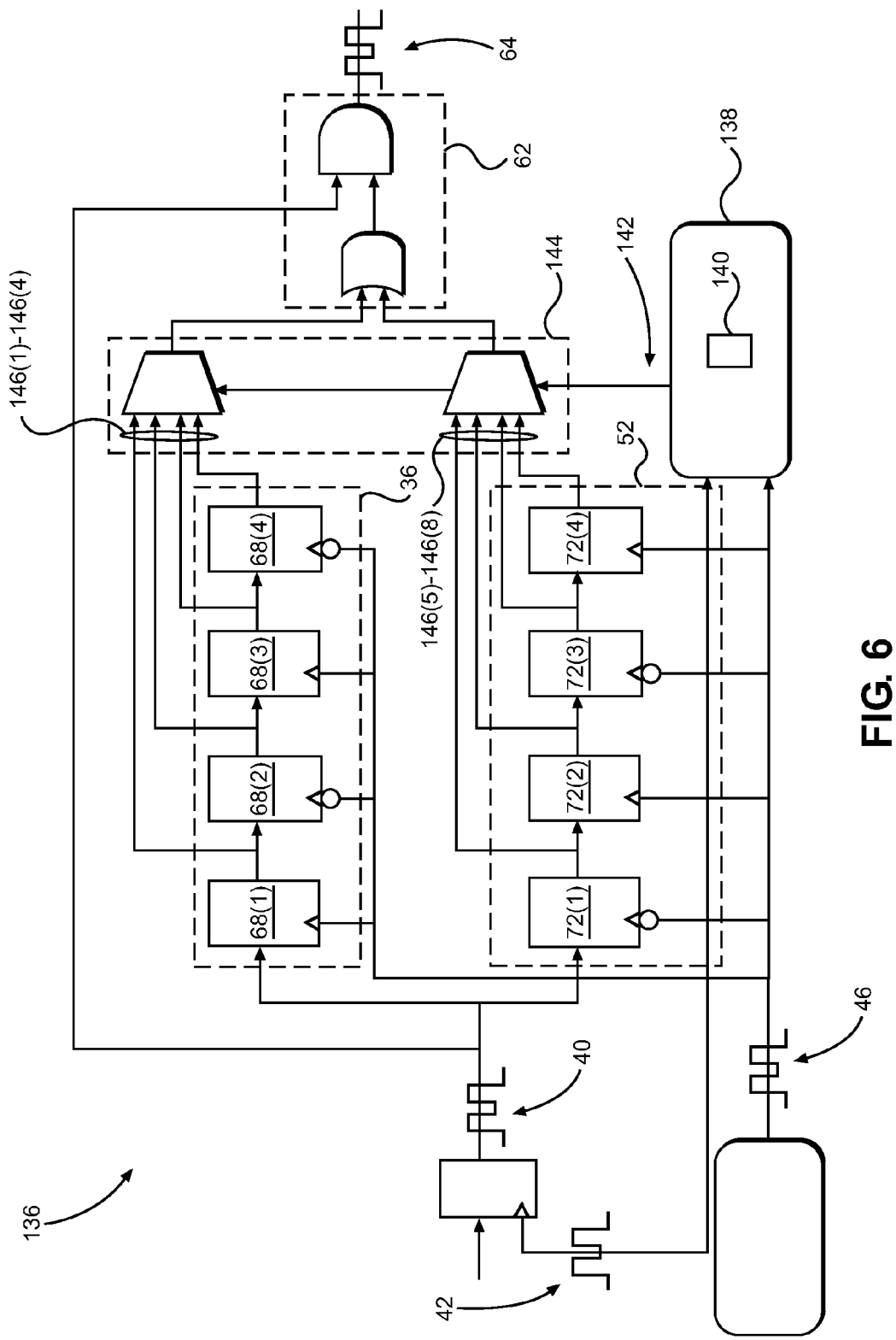
FIG. 6 is a block diagram of an exemplary delay circuit employing a frequency compensation circuit used to select a particular delay.

Although the delay circuit 34 may be configured to generate a highly accurate time delay, such a delay may vary due to how PVT variations affect the stability of the fast clock signal 46. In this regard, FIG. 6 illustrates an exemplary delay circuit 136 employing a frequency compensation circuit 138 used to compensate the output enable out signal 64 based on a delay variance between the slow clock signal 42 and the fast clock signal 46. The delay circuit 136 includes certain common components and circuits with the delay circuit 34 in FIG. 3, which are shown with common element numbers between FIGS. 3 and 6. In an exemplary aspect, the frequency compensation circuit 138 includes a counter circuit 140 configured to count the number of transitions of the fast clock signal 46 that occur during a single cycle of the slow clock signal 42. The frequency compensation circuit 138 is configured to calculate the delay variance between the slow clock signal 42 and the fast clock signal 46 based on the number of counted transitions of the fast clock signal 46. Such a delay variance is used by the frequency compensation circuit 138 to generate a selection signal 142 that is provided to a multiplexer 144 in the delay circuit 136. The multiplexer 144 includes data inputs 146(1)-146(4) coupled to an output of each first shift element 68(1)-68(4), and data inputs 146(5)-146(8) coupled to an output of each second shift element 72(1)-72(4). Further, the multiplexer 144 is configured to provide the first strobe signal 48 and the second strobe signal 58 to the simple logic 62 based on the selection signal 142 generated by the frequency compensation circuit 138. Thus, the frequency compensation circuit 138 is able to compensate the output enable out signal 64 by determining which stage within the first shift register chain 36 and the second shift register chain 52 provides the most accurate delay in light of the effects that PVT variations have on the fast clock signal 46.

Figure 7:
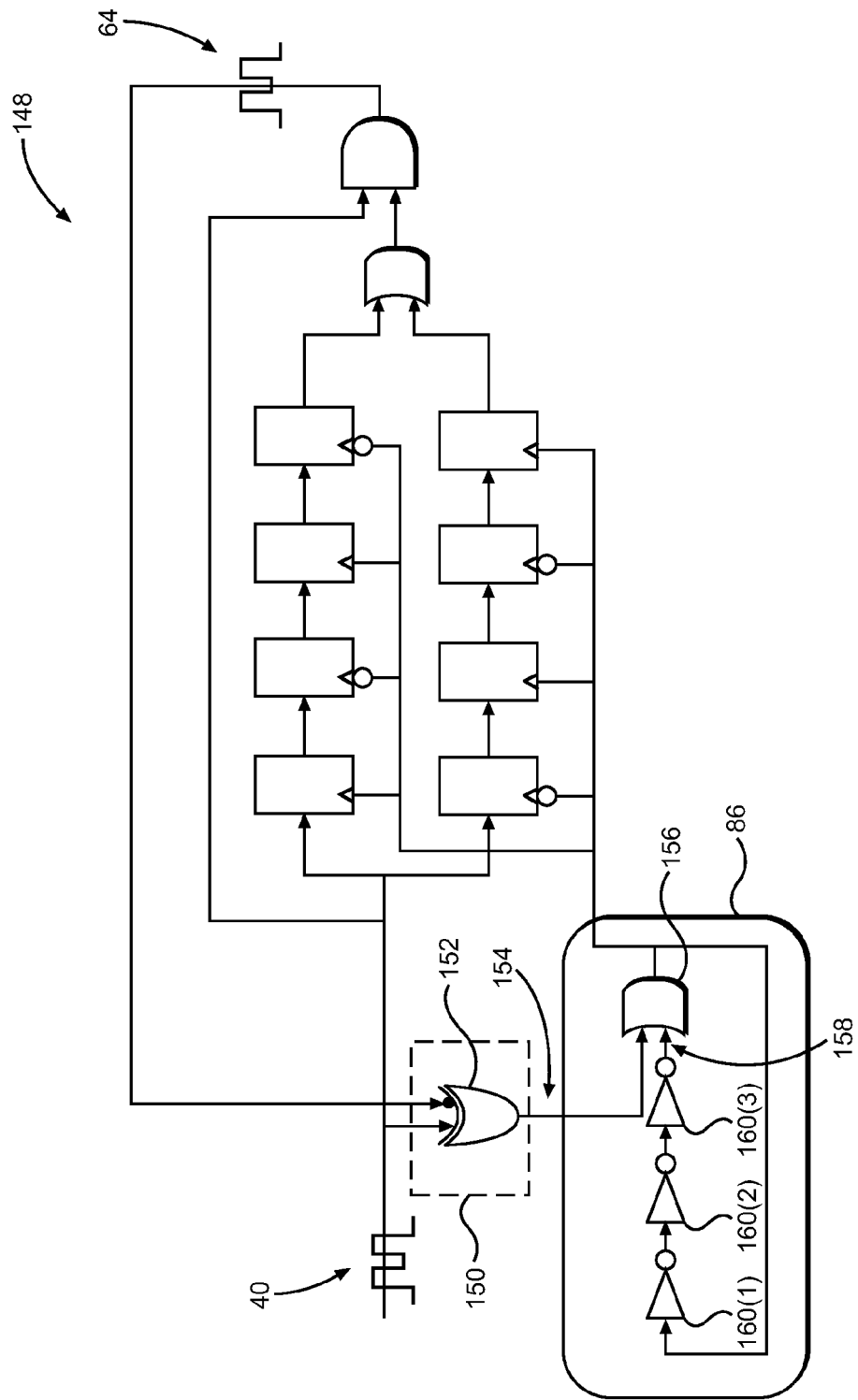
FIG. 7 is a block diagram of an exemplary delay circuit employing a power reduction circuit used to enable and disable a fast clock to reduce power consumption.

Although the delay circuit 34 in FIG. 3 is configured to provide a highly accurate time delay while potentially using less area and power as compared to the conventional delay circuit 30 in FIG. 2, additional components may be included in other aspects to reduce power consumption further. In this regard, FIG. 7 illustrates an exemplary delay circuit 148 employing a power reduction circuit 150 configured to reduce power consumption. The delay circuit 148 includes certain common components and circuits with the delay circuit 34 in FIG. 3, which are shown with common element numbers between FIGS. 3 and 7. In an exemplary aspect, the power reduction circuit 150 is configured to pause the fast clock signal 46 when the output enable in signal 40 is logically equal to the output enable out signal 64. In particular, the power reduction circuit 150 includes an XOR logic gate 152 configured to receive the output enable in signal 40 and the output enable out signal 64. The XOR logic gate 152 is configured to use such inputs to provide a power reduction signal 154 to the ring oscillator 86 generating the fast clock signal 46. Thus, when the output enable in signal 40 has the same logical value as the output enable out signal 64, the power reduction signal 154 provides a high logic value to an AND logic gate 156 in the ring oscillator 86. The AND logic gate 156 is configured to receive an inverter signal 158 from a final inverter 160(3) of serially coupled inverters 160(1)-160(3) in addition to the power reduction signal 154. In this manner, the ring oscillator 86 will not generate the fast clock signal 46 when a delay is not needed, thereby reducing power consumption of the delay circuit 148 without negatively affecting the delay functionality. Notably, other aspects may use other XOR-based and/or AND-based logic gates in place of the XOR logic gate 152 and the AND logic gate 156, respectively, to achieve similar functionality.

Aspects included herein are described as used within a device employing the SoundWire™ protocol. For example, the delay circuits, and related systems and methods may be employed within the slave control systems 28(1)-28(4) in the SoundWire™ system 10 in FIG. 1. However, the delay circuits, and related systems and methods may also be employed within devices employing other protocols.

The delay circuits, and related systems and methods according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
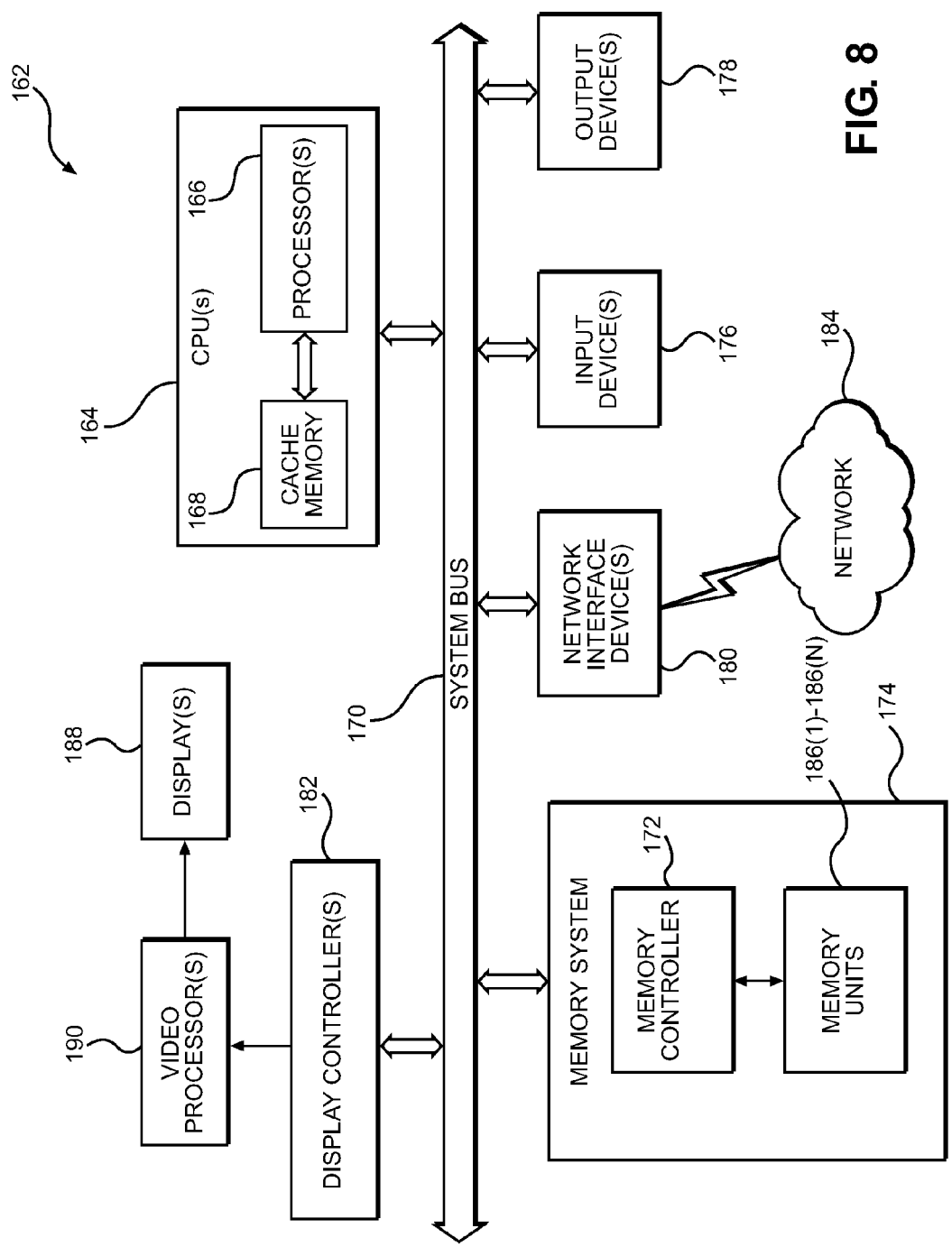
FIG. 8 is a block diagram of an exemplary processor-based system that can include the delay circuit in FIG. 3.

In this regard, FIG. 8 illustrates an example of a processor-based system 162 that can employ the delay circuit 34 illustrated in FIG. 3. In this example, the processor-based system 162 includes one or more central processing units (CPUs) 164, each including one or more processors 166. The CPU(s) 164 may have cache memory 168 coupled to the processor(s) 166 for rapid access to temporarily stored data. The CPU(s) 164 is coupled to a system bus 170 and can intercouple master and slave devices included in the processor-based system 162. As is well known, the CPU(s) 164 communicates with these other devices by exchanging address, control, and data information over the system bus 170. For example, the CPU(s) 164 can communicate bus transaction requests to a memory controller 172 as an example of a slave device. Although not illustrated in FIG. 8, multiple system buses 170 could be provided, wherein each system bus 170 constitutes a different fabric.

Other master and slave devices can be connected to the system bus 170. As illustrated in FIG. 8, these devices can include a memory system 174, one or more input devices 176, one or more output devices 178, one or more network interface devices 180, and one or more display controllers 182, as examples. The input device(s) 176 can include any type of input device, including but not limited to input keys, switches, voice processors, etc. The output device(s) 178 can include any type of output device, including but not limited to audio, video, other visual indicators, etc. The network interface device(s) 180 can be any devices configured to allow exchange of data to and from a network 184. The network 184 can be any type of network, including but not limited to a wired or wireless network, a private or public network, a local area network (LAN), a wide local area network, a wireless local area network, and the Internet. The network interface device(s) 180 can be configured to support any type of communications protocol desired. The memory system 174 can include one or more memory units 186(1)-186(N).

The CPU(s) 164 may also be configured to access the display controller(s) 182 over the system bus 170 to control information sent to one or more displays 188. The display controller(s) 182 sends information to the display(s) 188 to be displayed via one or more video processors 190, which process the information to be displayed into a format suitable for the display(s) 188. The display(s) 188 can include any type of display, including but not limited to a cathode ray tube (CRT), a light emitting diode display (LED), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A delay circuit for delaying an output enable signal, comprising:
   a first shift register chain comprising:
     a first chain input configured to receive an output enable in signal, wherein the output enable in signal is based on a slow clock signal;
     a first chain clock input configured to receive a fast clock signal; and
     a first chain output configured to provide a first strobe signal;
   a second shift register chain comprising:
     a second chain input configured to receive the output enable in signal;
     a second chain clock input configured to receive the fast clock signal; and
     a second chain output configured to provide a second strobe signal, wherein each transition of the second strobe signal is opposite of a corresponding transition of the first strobe signal; and
   a delayed output configured to provide an output enable out signal based on the first strobe signal, the second strobe signal, and the output enable in signal.

2. The delay circuit of claim 1, further comprising a flip-flop comprising:
   a flip-flop input configured to receive a data signal;
   a flip-flop clock input configured to receive the slow clock signal; and
   a flip-flop output configured to provide the output enable in signal.

3. The delay circuit of claim 1, further comprising a fast clock configured to provide the fast clock signal.

4. The delay circuit of claim 3, wherein the fast clock comprises a ring oscillator.

5. The delay circuit of claim 1, further comprising an OR-based logic gate comprising:
   a first OR-based input configured to receive the first strobe signal;
   a second OR-based input configured to receive the second strobe signal; and
   an OR-based output.

6. The delay circuit of claim 5, further comprising an AND-based logic gate comprising:
   a first AND-based input configured to receive the output enable in signal;
   a second AND-based input coupled to the OR-based output; and
   the delayed output.

7. The delay circuit of claim 1, wherein:
   the first shift register chain comprises an even number of first shift elements; and
   the second shift register chain comprises an even number of second shift elements.

8. The delay circuit of claim 1, further comprising a frequency compensation circuit configured to:
   receive the fast clock signal;
   receive the slow clock signal; and
   compensate the output enable out signal based on a delay variance between the slow clock signal and the fast clock signal.

9. The delay circuit of claim 8, wherein the frequency compensation circuit comprises:
   a counter circuit configured to count a number of fast clock signal transitions that occur during a cycle of the slow clock signal; and
   the frequency compensation circuit further configured to determine the delay variance between the slow clock signal and the fast clock signal based on the number of counted fast clock signal transitions.

10. The delay circuit of claim 8, wherein:
    the frequency compensation circuit is further configured to provide a selection signal based on the delay variance; and
    the delay circuit further comprises:
      a multiplexer, wherein data inputs of the multiplexer are coupled to individual elements within the first shift register chain and individual elements within the second shift register chain; and
      the multiplexer is configured to:
        provide the first strobe signal based on the selection signal received from the frequency compensation circuit; and
        provide the second strobe signal based on the selection signal received from the frequency compensation circuit.

11. The delay circuit of claim 1, further comprising a power reduction circuit configured to pause the fast clock signal when the output enable in signal and the output enable out signal are logically equal.

12. The delay circuit of claim 4, further comprising:
    a power reduction circuit configured to pause the fast clock signal when the output enable in signal and the output enable out signal are logically equal; and
    the power reduction circuit comprises an XOR-based logic gate configured to:
      receive the output enable in signal and the output enable out signal; and
      provide a power reduction signal.

13. The delay circuit of claim 12, wherein the ring oscillator comprises:
    a plurality of serially coupled inverters; and
    an AND-based logic gate configured to:
      receive an inverter signal from a final inverter from among the plurality of serially coupled inverters;
      receive the power reduction signal; and
      provide the fast clock signal.

14. The delay circuit of claim 1 integrated into an integrated circuit (IC).

15. The delay circuit of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

16. A method for delaying an output enable signal, comprising:
   receiving a fast clock signal;
   receiving a slow clock signal;
   receiving an output enable in signal, wherein the output enable in signal is based on the slow clock signal;
   generating a first strobe signal based on the output enable in signal and the fast clock signal;
   generating a second strobe signal based on the output enable in signal and the fast clock signal, wherein each transition of the second strobe signal is opposite of each corresponding transition of the first strobe signal; and
   providing an output enable out signal based on the first strobe signal, the second strobe signal, and the output enable in signal.

17. The method of claim 16, further comprising compensating the output enable out signal based on a delay variance between the slow clock signal and the fast clock signal.

18. The method of claim 17, wherein compensating the output enable out signal comprises:
   counting a number of fast clock signal transitions that occur during a cycle of the slow clock signal; and
   determining the delay variance between the slow clock signal and the fast clock signal based on the number of counted fast clock signal transitions.

19. The method of claim 16, further comprising pausing the fast clock signal when the output enable in signal is logically equal to the output enable out signal.

20. A delay circuit for delaying an output enable, comprising:
   a first shift register chain configured to generate a first strobe signal;
   a second shift register chain configured to generate a second strobe signal, wherein each transition of the second strobe signal is opposite of each corresponding transition of the first strobe signal; and
   a delayed output configured to provide an output enable out signal based on the first strobe signal, the second strobe signal, and an input signal.

21. The delay circuit of claim 20, further comprising an OR-based logic gate comprising:
   a first OR-based input configured to receive the first strobe signal;
   a second OR-based input configured to receive the second strobe signal; and
   an OR-based output.

22. The delay circuit of claim 21, further comprising an AND-based logic gate comprising:
   a first AND-based input configured to receive the input signal;
   a second AND-based input coupled to the OR-based output; and
   the delayed output.

23. The delay circuit of claim 20, further comprising a frequency compensation circuit configured to:
   receive a fast clock signal;
   receive a slow clock signal; and
   compensate the output enable out signal based on a delay variance between the slow clock signal and the fast clock signal.

24. The delay circuit of claim 20, further comprising a power reduction circuit configured to pause a fast clock signal when the input signal and the output enable out signal are logically equal.

25. A system comprising:
   a communications bus compliant with SoundWire™ protocol, the communications bus comprising:
      a data wire; and
      a clock wire;
   a master device coupled to one or more slave devices via the communications bus; and
   each of the one or more slave devices comprising a delay circuit, wherein each delay circuit among a plurality of delay circuits comprises:
      a first shift register chain comprising:
         a first chain input configured to receive an output enable in signal, wherein the output enable in signal is based on a slow clock signal provided on the clock wire;
         a first chain clock input configured to receive a fast clock signal; and
         a first chain output configured to provide a first strobe signal; and
      a second shift register chain comprising:
         a second chain input configured to receive the output enable in signal;
         a second chain clock input configured to receive the fast clock signal; and
         a second chain output configured to provide a second strobe signal, wherein each transition of the second strobe signal is opposite of each corresponding transition of the first strobe signal; and
      a delayed output configured to provide an output enable out signal based on the first strobe signal, the second strobe signal, and the output enable in signal.

* * * * *